(12) United States Patent
Seefried

(10) Patent No.: US 7,038,554 B2
(45) Date of Patent: May 2, 2006

(54) CROSSTALK COMPENSATION WITH BALANCING CAPACITANCE SYSTEM AND METHOD

(75) Inventor: Jeffrey P. Seefried, Lake Stevens, WA (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 36 days.

(21) Appl. No.: 10/847,216

(22) Filed: May 17, 2004

(65) Prior Publication Data

US 2005/0253662 A1    Nov. 17, 2005

(51) Int. Cl.
*H01P 1/00* (2006.01)
*H01R 24/00* (2006.01)
(52) U.S. Cl. .................... 333/24 C; 333/260
(58) Field of Classification Search ........... 333/24 C, 333/254, 255, 260; 439/676, 941
See application file for complete search history.

(56) References Cited

U.S. PATENT DOCUMENTS

| | | | |
|---|---|---|---|
| 5,626,497 A | 5/1997 | Bouchan et al. | |
| 5,967,853 A | 10/1999 | Hashim | |
| 6,007,369 A | 12/1999 | Kennedy et al. | |
| 6,089,923 A * | 7/2000 | Phommachanh | 439/676 |
| 6,379,157 B1 * | 4/2002 | Curry et al. | 439/676 |
| 6,533,618 B1 | 3/2003 | Aekins | |
| 6,840,816 B1 * | 1/2005 | Aekins | 439/676 |
| 2005/0136729 A1 * | 6/2005 | Redfield et al. | 439/409 |

* cited by examiner

*Primary Examiner*—Dean Takaoka
(74) *Attorney, Agent, or Firm*—Brian L. Johnson; Davis Wright Tremaine LLP

(57) ABSTRACT

A insulation displacement connector (IDC) patch panel includes a circuit (PC) board with interdigitated capacitance for balancing out inherent capacitance found within IDCs of the panel and conventional plug connectors coupled to the panel. Unwanted cross-talk signals are reduced as a consequence.

14 Claims, 13 Drawing Sheets

LAMINATION SEQUENCE

LAYER 2 (INNER)

LAYER 3 (INNER)

CROSSTALK COMPENSATION WITH BALANCING CAPACITANCE SYSTEM AND METHOD

BACKGROUND OF THE INVENTION

1. Field of the Invention

The present invention is directed to communication connectors, and, more specifically, to a communication connector with improved crosstalk reduction.

2. Description of the Related Art

The widespread use of communication devices has spurred the development of communication connectors. Initially, communication devices such as telephones, computer terminals, and the like were hardwired. For example, the wire cable for a telephone was coupled directly through a hole in a wall plate to electrical terminals.

Modern telephone connectors use an industry standard receptacle mounted in the wall and a mating industry standard plug at the end of a telephone cord. The use of industry standard connectors permits the convenient installation of telephones. Similarly, industry standard connectors have been developed for other communication devices such as computers. For example, a personal computer may be coupled to a local area network (LAN) via a communication connector similar to those used with telephones.

The use of communication connectors with telephones does not result in the degradation of signal quality because telephones typically have limited bandwidth. However, high-speed communication devices, such as computers, can suffer significant degradation of signal quality due to conditions such as crosstalk occurring where a signal on a line pair interferes with a signal on another line pair.

BRIEF SUMMARY OF THE INVENTION

The present invention resides in a system for at least one plug connector, the plug connector having a plurality of plug connector elements being grouped into pairs, each pair of the plurality of plug connector elements having a tip plug connector element and a ring plug connector element configured to be coupled to a different wire pair, the plug connector having a first capacitance between a tip plug connector element of a first pair of the plurality of plug connector elements and a ring plug connector element of a second pair of the plurality of plug connector elements, the plug connector having a second capacitance between a ring plug connector element of the first pair of the plurality of plug connector elements and a tip plug connector element of the second pair of the plurality of plug connector elements, the first capacitance being greater than the second capacitance.

Aspects include a jack connector being shaped to receive the plug connector, the jack connector having a plurality of jack contact members and configured to receive the plug connector such that each of the plurality of jack contact members is electrically coupled to a different one of the plurality of plug connector elements. The plurality of jack contact members include a first tip jack contact member and a first ring jack contact member positioned to electrically couple with the tip plug connector element and the ring plug connector element, respectively, of the first pair of the plurality of plug connector elements when the jack connector receives the plug connector, and a second tip jack contact member and a second ring jack contact member positioned to electrically couple with the tip plug connector element and the ring plug connector element, respectively, of the second pair of plug connector elements when the jack connector receives the plug connector.

Aspects further include an insulation displacement connector (IDC) configured to receive a plurality of wires and having a plurality of IDC elements, each of the plurality of IDC elements configured to be coupled to a different one of the plurality of wires. A circuit board has a plurality of jack pads, a plurality of IDC pads, and a plurality of internal conductors. Each of the plurality of jack pads are electrically coupled to a different one of the plurality of jack contact members so that a first tip jack pad, a first ring jack pad, a second tip jack pad, and a second ring jack pad are electrically coupled to the first tip jack contact member, the first ring jack contact member, the second tip jack contact member, and the second ring jack contact member, respectively. Each of the plurality of IDC pads are electrically coupled to a different one of the plurality of IDC elements. Each of the plurality of internal conductors are electrically coupled to a different one of the plurality of jack pads and a different one of the plurality of IDC pads.

Aspects further include a third capacitance electrically coupled between the first ring jack pad and the second tip jack pad, the third capacitance sized, at least in part, with respect to the difference in values between the first capacitance and the second capacitance to reduce cross-talk between the first and second pairs of the plurality of plug connector elements. Aspects further include wherein the jack connector is configured to engaged with the plug connector as an RJ45 jack connector, the plurality of internal conductors are a plurality of wire traces, and the third capacitance results from at least one interdigitated portion of one of the plurality of wire traces.

Aspects further include wherein the plurality of IDC elements are grouped into pairs, each pair of the plurality of IDC elements having a tip IDC element and a ring IDC element configured to be coupled to a different wire pair, the plurality of IDC pads of the circuit board including a first tip IDC pad electrically coupled to the first tip jack pad, a first ring IDC pad electrically coupled to the first ring jack pad, a second tip IDC pad electrically coupled to the second tip jack pad, and a second ring IDC pad electrically coupled to the second ring jack pad by ones of the plurality of internal conductors. Aspects further include wherein the IDC has a fourth capacitance electrically coupled between a first tip IDC element of a first pair of the plurality of IDC elements and a second ring IDC element of a second pair of the plurality of IDC elements, the first tip IDC element being electrically coupled to the first tip IDC pad, and the second ring IDC element being electrically coupled to the second ring IDC pad, a fifth capacitance electrically coupled between a first ring IDC element of the first pair of the plurality of IDC elements and a second tip IDC element of the second pair of the plurality of IDC elements, the first ring IDC element being electrically coupled to the first ring IDC pad, and the second tip IDC element being electrically coupled to the second tip IDC pad, the fourth capacitance being greater than the fifth capacitance, and wherein the third capacitance is further sized, at least in part, with respect to the difference in values between the fourth capacitance and the fifth capacitance.

Aspects further include a sixth capacitance electrically coupled between the first tip jack pad and the second tip jack pad, and a seventh capacitance electrically coupled between the first ring jack pad and the second ring jack pad, the sixth capacitance and the seventh capacitance being sized in values with respect to the values of the first capacitance, second capacitance, third capacitance, fourth capacitance, and fifth capacitance. Aspects further include wherein the sixth capacitance and the seventh capacitance are sized in values so that the sum of the values of the sixth capacitance and the seventh capacitance approximates the sum of the values of the first capacitance, the second capacitance, the third capacitance, the fourth capacitance and the fifth capacitance.

Aspects further include an insulation displacement connector (IDC) configured to receive a plurality of wires and having a plurality of IDC elements, each of the plurality of IDC elements configured to be coupled to a different one of the plurality of wires, the plurality of IDC elements being grouped into pairs, each pair of the plurality of IDC elements having a tip IDC element and a ring IDC element configured to be coupled to a different wire pair, the IDC having a first capacitance between a first tip IDC element of a first pair of the plurality of IDC elements and a second ring IDC element of a second pair of the plurality of IDC elements, the IDC having a second capacitance between a first ring IDC element of the first pair of the plurality of IDC elements and a second tip IDC element of the second pair of the plurality of IDC elements, the first capacitance being greater than the second capacitance.

Aspects further include a circuit board having a plurality of jack pads, a plurality of IDC pads, and a plurality of internal conductors, each of the plurality of jack pads being electrically coupled to a different one of the plurality of jack contact members, each of the plurality of IDC pads being electrically coupled to a different one of the plurality of IDC elements so that a first tip IDC pad, a first ring IDC pad, a second tip IDC pad and a second ring IDC pad are electrically coupled to the first tip IDC element, the first ring IDC element, the second tip IDC element, and the second ring IDC element, respectively, each of the plurality of internal conductors being electrically coupled to a different one of the plurality of jack pads and a different one of the plurality of IDC pads.

Aspects further include a third capacitance electrically coupled between the first ring IDC pad and the second tip IDC pad, the capacitance sized, at least in part, with respect to the difference in values between the first capacitance and the second capacitance to reduce cross-talk between the first and second pairs of the plurality of IDC elements.

Other features and advantages of the invention will become apparent from the following detailed description, taken in conjunction with the accompanying drawings.

BRIEF DESCRIPTION OF THE SEVERAL VIEWS OF THE DRAWING(S)

DETAILED DESCRIPTION OF THE INVENTION

Figure 1A:
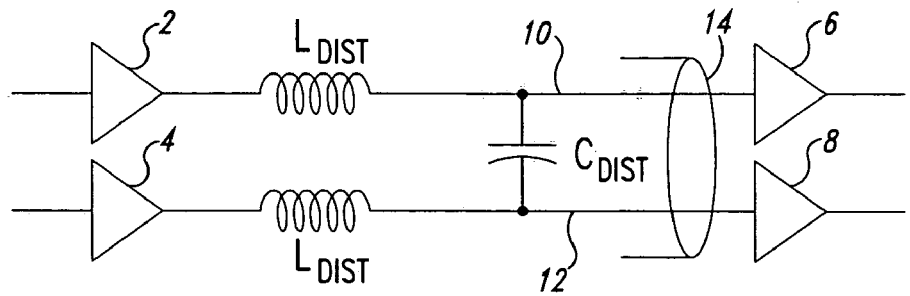
FIG. 1A is a schematic diagram illustrating a conventional communication transmission system.

Communication connectors offer easy and reliable connections for a variety of communication devices. A conventional communication transmission system is illustrated in the schematic diagram of FIG. 1A. The transmission system includes line drivers 2 and 4 and corresponding line receivers 6 and 8. A wire conductor 10 connects the line driver 2 to the line receiver 6. A wire conductor 12 connects the line driver 4 to the line receiver 8. FIG. 1A illustrates the wire conductors 10 and 12 as single conductors, which are typically bundled together as portions of a cable 14.

The wire conductors 10 and 12 are generally twisted in a parallel fashion to each other for the length of the cable 14. A capacitance CDIST and inductance LDIST are shown in FIG. 1A to model a distributed capacitive and inductive coupling between the wire conductors 10 and 12. A mutual inductance between the two inductances LDIST and the capacitance CDIST contributes to the coupling of electrical signals between the wire conductors 10 and 12. The signal that is coupled capacitively or inductively between conductors is an undesirable signal that may be termed a "leakage" signal or "crosstalk." At low frequencies, such as are typical in a telephone, the crosstalk between the wire conductors 10 and 12 is minimal because the distributed capacitance CDIST and inductance LDIST provide low coupling at such low frequencies. However, at higher frequencies, the crosstalk between the wire conductors 10 and 12 becomes significant.

Figure 1B:
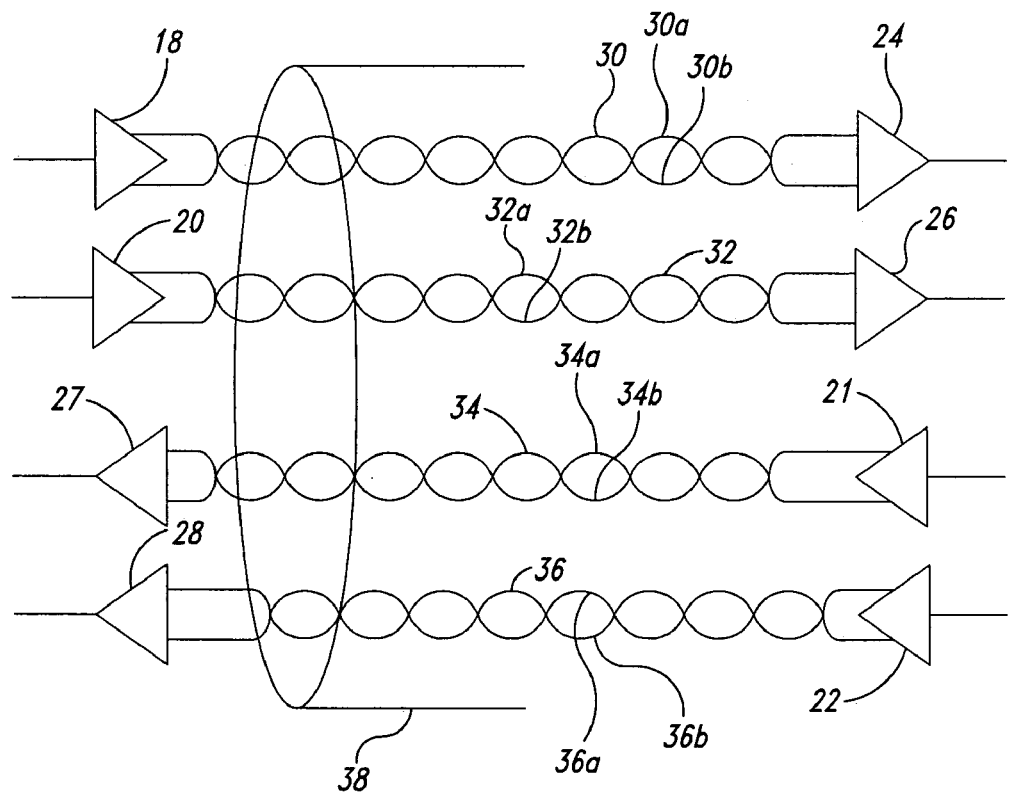
FIG. 1B is a schematic diagram illustrating a conventional technique for transmission of communication signals using differential circuitry and a twisted pair wire cable.

To minimize crosstalk, designers often use twisted pair cables and differential amplifiers, such as illustrated in FIG. 1B. FIG. 1B includes differential line drivers 18, 20, 21 and 22, which are coupled to differential line receivers 24, 26, 27 and 28, respectively. The differential line driver 18 is coupled to the differential line receiver 24 by a twisted pair cable 30 having a "tip" wire 30a and a "ring" wire 30b. Similarly, a twisted pair cable 32, having a "tip" wire 32a and a "ring" wire 32b, couples the differential line driver 20 to the differential line receiver 26, a twisted pair cable 34 having a "tip" wire 34a and a "ring" wire 34b couples the differential line driver 21 to the differential line receiver 27, and a twisted pair cable 36 having a "tip" wire 36a and a "ring" wire 36b couples the differential line driver 22 to the differential line receiver 28. The twisted pair cables 30–36 are typically referred to as twisted wire pairs or wire pairs (possibly not all portions being twisted) and are portions of a cable 38. Each of the twisted pair cables 30–36 may be individually shielded to provide additional protection from crosstalk.

As is known in the art, the differential line receivers 24–28 are designed to reject signals that are present on both conductors of their respective twisted pair cables 30–36. The degree to which the differential line receivers 24–28 can reject these "common mode" signals is indicated by a common mode rejection ratio (CMRR). The system illustrated in FIG. 1B is an improvement over that illustrated in FIG. 1A because crosstalk between the twisted pair cables is canceled out by the CMRR of the differential line receivers. For example, a signal transmitted over the twisted pair cable 34 may be capacitively and inductively coupled to the twisted pair cable 30. However, the capacitive coupling between the "tip" wire 34a and the "ring" wire 34b associated with the twisted pair cable 34 is substantially equal to the capacitive coupling associated with the "tip" wire 30a and the "ring" wire 30b of the twisted pair cable 30. The common mode rejection of the differential line receiver 24 effectively cancels the common mode crosstalk signal. Thus, the twisted pair conductors permit the transmission of data at a significantly higher bandwidth while reducing crosstalk to an acceptable level.

Figure 2A:
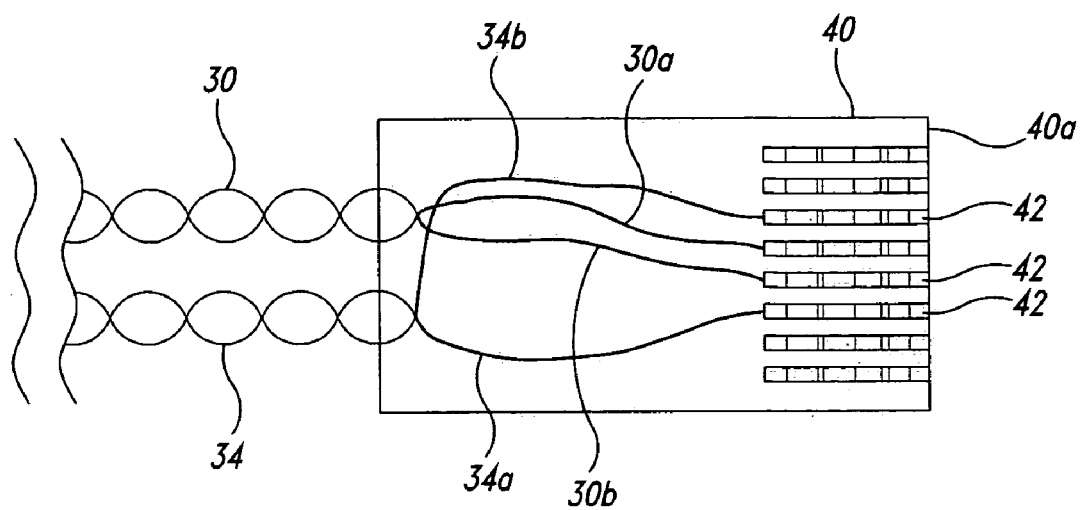
FIG. 2A is a schematic diagram of a conventional plug connector for use with the twisted pair wire cable of FIG. 1B.
Figure 2B:
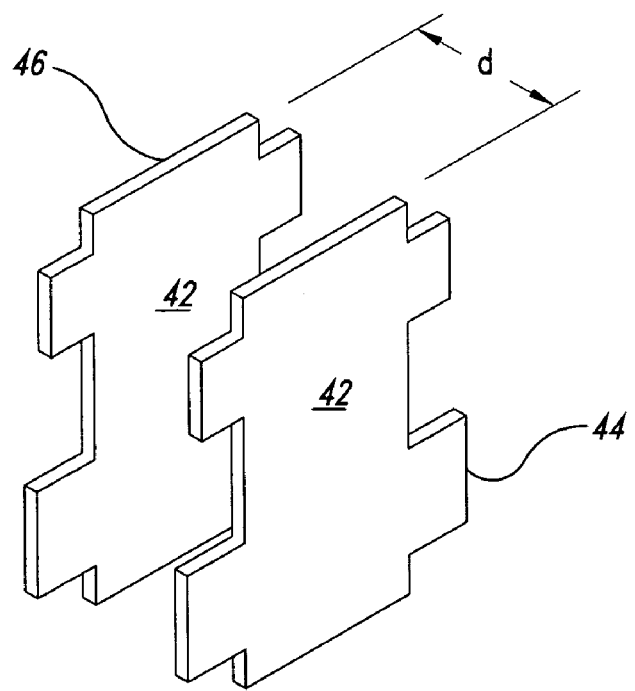
FIG. 2B is a perspective view of plug connector elements of the conventional plug connector of FIG. 2A.
Figure 2C:
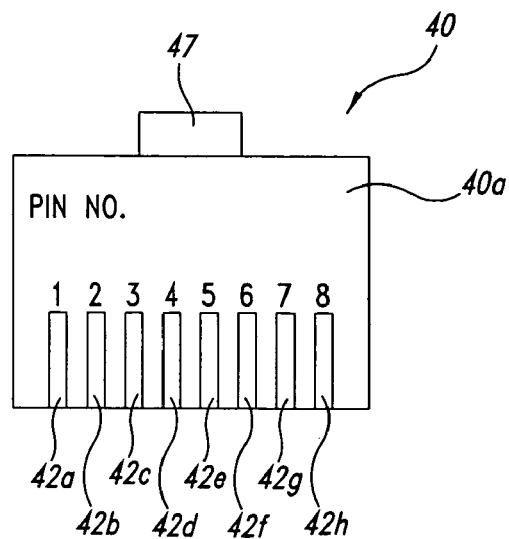
FIG. 2C is a front schematic view of the conventional plug connector of FIG. 2A showing pin assignment and configuration of the plug connector elements.
Figure 2D:
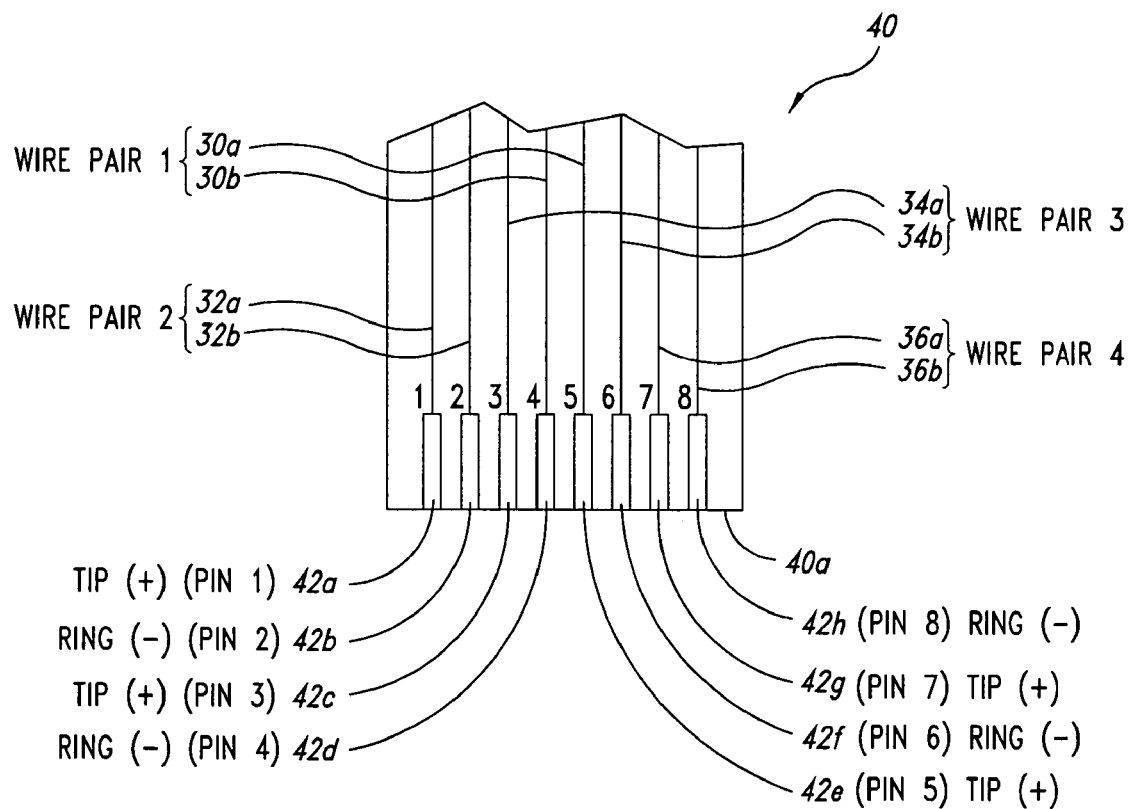
FIG. 2D is a top schematic sectional view of the conventional plug connector of FIG. 2A showing the wire pairs associated with the plug connector elements shown in FIG. 2C.
Figure 2E:
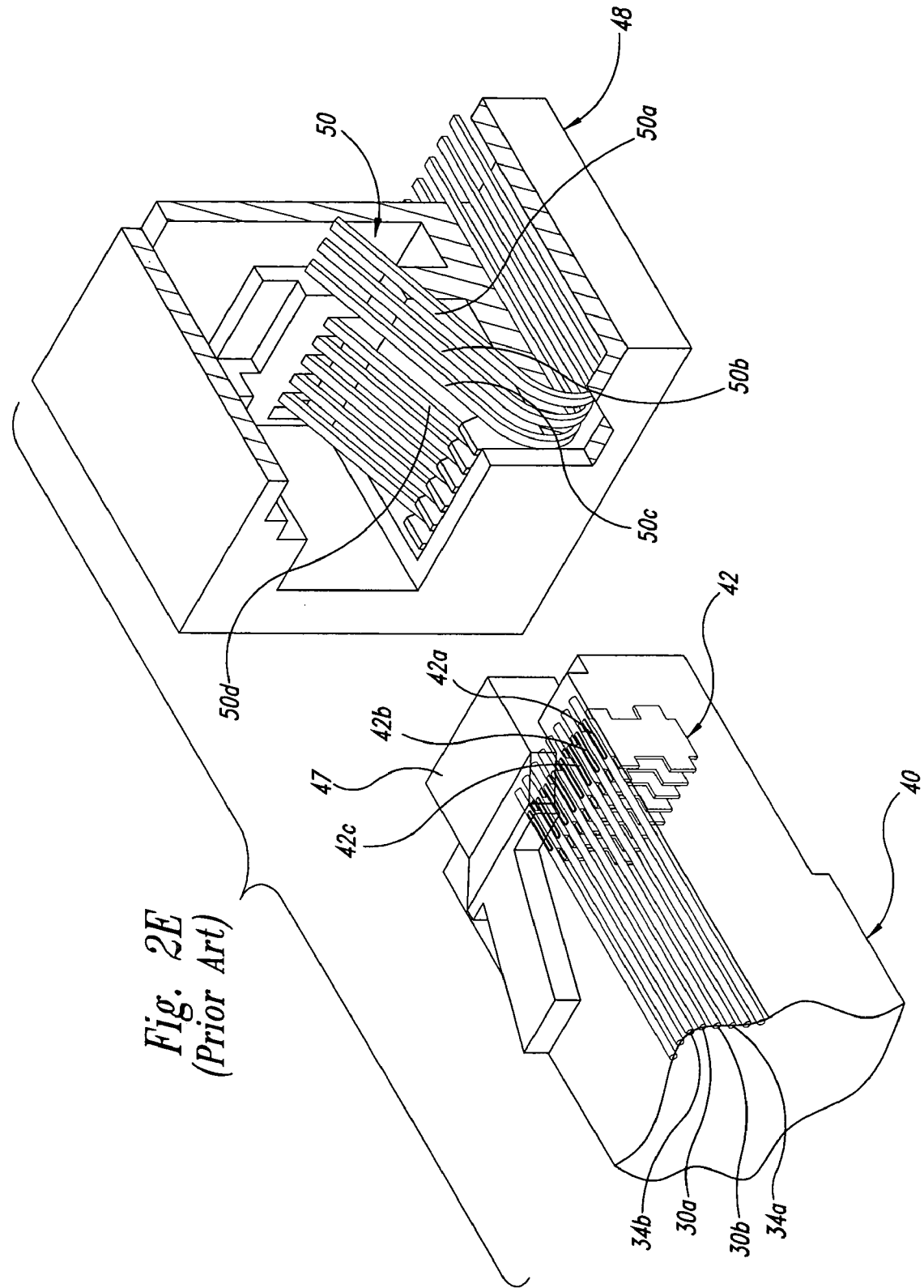
FIG. 2E is an isometric sectional view of the conventional plug connector and associated conventional mating communication jack connector.

The twisted pair conductors are typically terminated in a conventional plug connector 40, as illustrated in FIGS. 2A and 2C or a conventional communication jack adapter 48, as illustrated in FIG. 2E. FIG. 2A illustrates an industry standard RJ45 plug, which accommodates four sets of twisted pair cables (i.e., 8 wires). For the sake of simplicity, FIG. 2A only illustrates the connection of the innermost positioned two twisted pair cables 30 and 34. The plug connector 40 couples with the conventional compatible mating communication jack connector 48 (shown in FIG. 2E) having contact members 50 in a manner well known in the art.

Implementations of the plug connector 40 include a plurality of metal contact or plug connector elements 42, as best shown in FIGS. 2B and 2E, to electrically connect the wire conductors of the twisted pair cables 30 and 34 to the mating conventional communication jack connector 48. The plug connector elements 42 may be plates, resilient wires or take other conventional forms. The twisted pair cable 30 comprises two individual wires occupying center positions within the plug connector 40, with the center "tip" wire 30a and the center "ring" wire 30b being untwisted within the plug connector 40 to permit their electrical connection to two corresponding plug connector elements 42. Similarly, the twisted pair cable 34 comprises the two individual wires occupying a split position within the plug connector 40, with the split "tip" wire 34a and the split "ring" wire 34b also being untwisted within the plug connector 40 to permit their electrical connection to two corresponding plug connector elements 42. With the industry standard RJ45 plug, the center "tip" wire 30a and the center "ring" wire 30b of the twisted pair cable 30 are coupled to the innermost pair of the plug connector elements 42 of the plug connector 40. The split "tip" wire 34a of the twisted pair cable 34 is coupled to the plug connector element 42 on one side of the center "tip" wire 30a and the center "ring" wire 30b, while the split "ring" wire 34b is coupled to the plug connector element 42 on the opposite side of the center "tip" wire 30a and the center "ring" wire 30b. In this configuration, the untwisted center "tip" wire 30a and the center "ring" wire 30b of the twisted pair cable 30 run inside and generally along side to the untwisted split "tip" wire 34a and the split "ring" wire 34b of the twisted pair cable 34, as illustrated in FIG. 2A. As shown in FIG. 2C, the plug connector elements 42 are exposed along a front face 40a of the plug connector 40 for electrical coupling using a tab 47 to secure engagement with the communication jack connector 48.

Because portions of the twisted pair cables 30 and 34 are untwisted within the plug connector 40, the individual center "tip" wire 30a and the center "ring" wire 30b may be differentially exposed to crosstalk from untwisted wires of the twisted pair cable 34 as well as the untwisted wires of the twisted pair cables 32 and 36 (not illustrated in FIG. 2A). That is, the crosstalk from the twisted pair cables 32, 34, and 36 may not occur equally in the individual center "tip" wire 30a and the center "ring" wire 30b in the portion of the twisted pair cable 30 that is untwisted. An industry testing standard, designated as TIA 568A, utilizes an RJ45 plug as a standard plug while testing hardware including category 5, category 5e, and category 6 communication systems. Furthermore, TIA-568-B.2-1 also involves category 6 performance requirements of patch panel modules for component rated connecting hardware. A worst case crosstalk condition for crosstalk on an RJ45 plug occurs between the twisted pair cable 30 and the twisted pair cable 34 illustrated in FIG. 2A. The untwisted center "tip" wire 30a and the center "ring" wire 30b are coupled to the innermost plug connector elements 42 of the plug connector 40 while the untwisted split "tip" wire 34a and the split "ring" wire 34b are separated and coupled to the plug connector elements 42 on opposite outer sides of the innermost plug connector elements 42 such that the center "tip" wire 30a and the center "ring" wire 30b are located intermediate the split "tip" wire 34a and the split "ring" wire 34b. Measurements of this worst case condition have indicated that the crosstalk between the individual wires of the twisted pair cables 30 and 34 while in an untwisted state result in a signal-to-crosstalk level of approximately 40 decibels (dB) at 100 megahertz (MHz). Under these circumstances, the differential signal caused by the leakage is significant and cannot be canceled by a differential line receiver. While other wires within the RJ45 plug have a different signal-to-crosstalk level ratio, there is still an appreciable differential signal caused by leakage among the various wire conductors in the untwisted portion within the plug connector 40.

Crosstalk in the conventional plug connector 40 is also caused by the physical construction of the plug connector elements 42 and the materials used in the construction of the communication connector. FIG. 2B illustrates one implementation for a pair of the plug connector elements 42, each having a solid metal plate with a contact surface 44 and a terminal surface 46. The contact surface 44 is used to couple the connector elements 42 to the wire cable while the terminating surface 46 is used to couple the connector elements to the mating connector. The industry standard RJ45 plug contains eight plug connector elements 42. However, for the sake of simplicity, FIG. 2B illustrates only two plug connector elements 42. This construction of the plug connector elements 42 can add to the crosstalk experienced.

The plug connector elements 42 are mounted within the plug connector 40 and are arranged parallel to each other and spaced apart at a distance d. Each of the plug connector elements 42 acts much as a plate in a parallel plate capacitor. As is known to those of ordinary skill in the art, the capacitance formed between the plug connector elements 42 is directly proportional to the surface area of the plug connector elements and is inversely proportional to the square of the distance d separating the plug connector elements.

The conventional plug connector 40 is molded from a polycarbonate material, which acts as a dielectric constant. Each of the plug connector elements 42 is embedded in the polycarbonate material when the plug connector 40 is manufactured. The capacitance between the plug connector elements 42 is increased through the use of this dielectric material between the connector elements. Therefore, the capacitance between the individual plug connector elements 42 is increased by virtue of the parallel surface areas of the plug connector elements and the high dielectric constant value of the polycarbonate material between them. Thus, while the plug connector 40 provides a simple and inexpensive connection method, it results in decreased performance due to crosstalk between the conductors within the body of the plug connector and the capacitance coupling between the plug connector elements themselves.

The plug connector 40 is shown in FIGS. 2C and 2D as having plug connector elements 42a–42h. As shown from a view of a front face 40a of the plug connector 40 in FIG. 2C, the plug connector elements 42a–42h are arranged according to a pin number 1 through 8, respectively. As discussed, the plug connector elements 42a–42h are wired to the "tip" wires and the "ring" wires of the twisted pair cables 30–36. As shown in FIG. 2D, the center "tip" and "ring" wires 30a and 30b, designated as wire pair 1, are electrically connected to the pin 5 and pin 4 plug connector elements 42e and 42d, respectively. The pin 1 and pin 2 plug connector elements 42a and 42b are electrically connected to left outside "tip" and "ring" wires 32a and 32b, respectively, designated as wire pair 2. The pin 3 and pin 6 plug connector elements 42c and 42f are electrically connected to the split "tip" and "ring" wires 34a and 34b, respectively, designated as wire pair 3. The pin 7 and pin 8 plug connector elements 42g and 42h are electrically connected to the right outside "tip" and "ring" wires 36a and 36b, respectively, designated as wire pair 4.

The conventional communication jack connector 48 is also likely to introduce crosstalk as well. An implementation of its contact members 50, as illustrated by the four contact members 50a–50d, are configured in a parallel arrangement as shown in FIG. 2E and allow crosstalk to occur between the contact members in a manner similar to that described above. The contact members 50 of the conventional communication jack connector 48 are so positioned and shaped to electrically couple to the terminal surfaces 46 of the plug connector elements 42 of the conventional plug connector 40.

Figure 3:
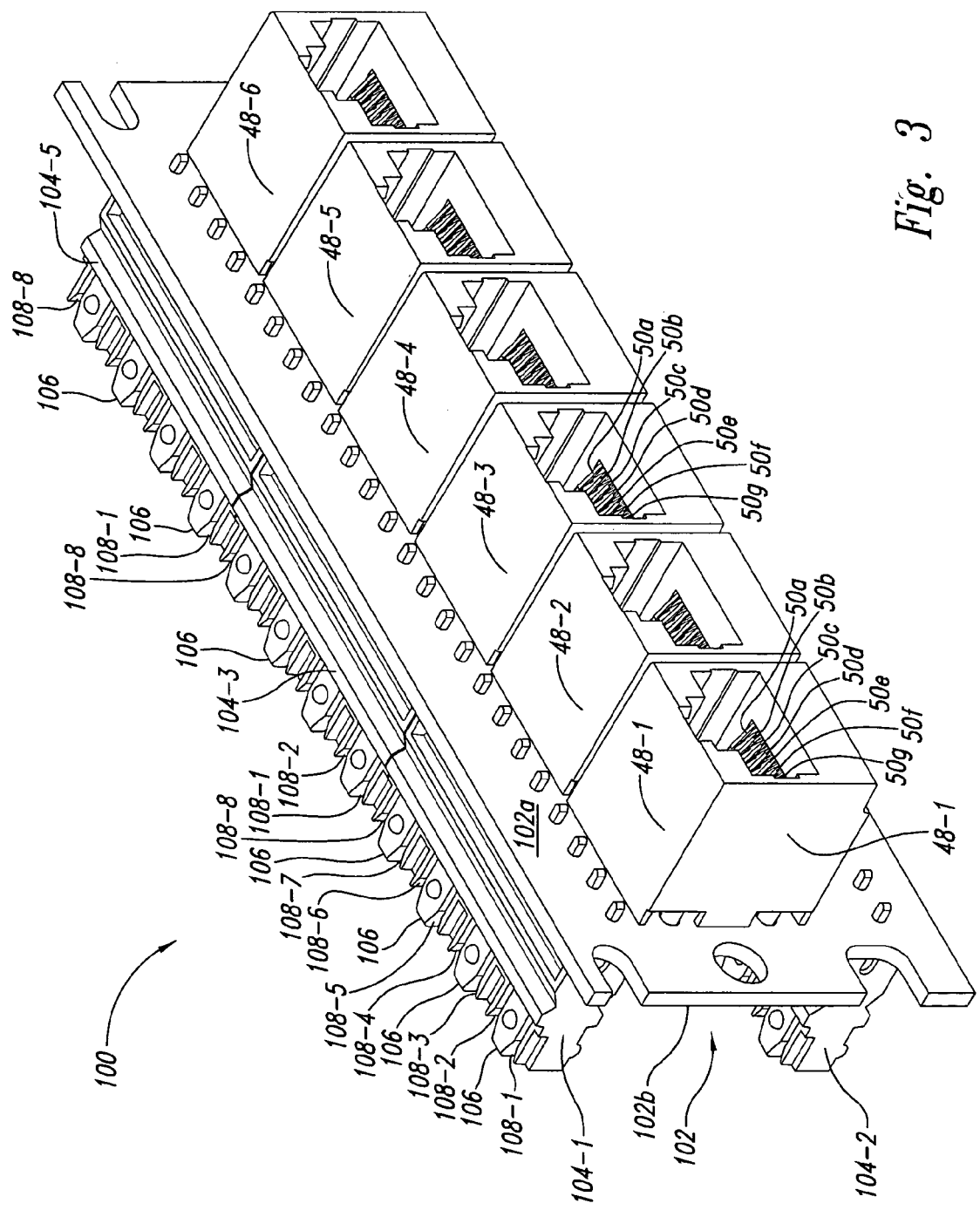
FIG. 3 is an isometric view of a reduced crosstalk patch panel of the present invention.

Six jack connectors 48-1 through 48-6 are shown in FIG. 3 as being part of a reduced crosstalk patch panel 100, which is subject of the present invention. The patch panel further includes a circuit board 102 having a first side 102a to fixedly attach and electrically couple the plurality of the jack connectors 48. The circuit board 102 has a second side 102b to fixedly attach and electrically couple six insulation displacement connectors (IDC) 104-1 through 104-6.

Figure 4:
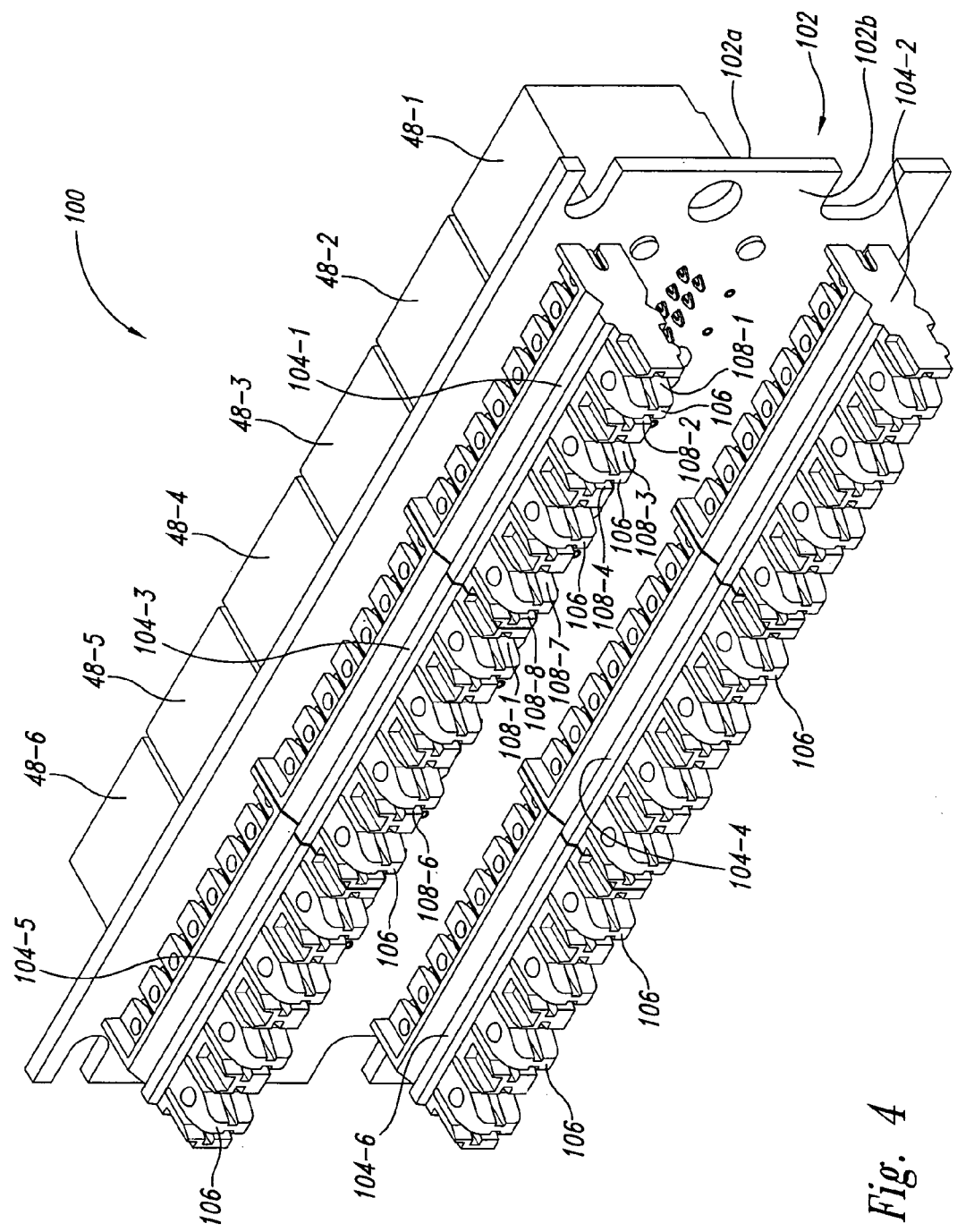
FIG. 4 is an isometric view of the reverse side of the patch panel of FIG. 3.

As better shown in FIG. 4, each of the IDCs 104 has four separators 106 with each separator having a wire slot 108 on either side of the separator to receive two wire ends (not shown) of a conductor wire pair per each of the separators. When each of the wire slots 108 receives one of the wire ends, the wire end becomes electrically coupled to a connector element (not shown) of the IDC 104 that is electrically coupled to the circuit board 102 as further explained below. Consequently, each exemplary IDC 104 has eight wire slots 108-1 through 108-8 corresponding to pins 1 through 8, respectively, that are electrically coupled through the circuit board 102 to contact members 50a–50h, respectively, of one of the jack connectors 48 corresponding to pins 1 through 8, respectively.

In the exemplary embodiment of FIG. 3, the jack connectors 48 of the patch panel 100 conform to the industry standard specifications for an RJ45 jack as controlled by the Federal Communications Commission under Title 47, Part 68. Performance of exemplary implementations of the patch panel 100 is also to conform to Telephone Industries Association Category 5 and 6 enhanced standards. However, the principles discussed are applicable to other patch panels using other communication connectors.

The industry standard external configuration allows the jack connectors 48 of the patch panel 100 to readily connect with an industry standard version of the plug connector 40, such as shown in FIG. 2E. While described as a jack connector, it is noted that the jack connectors 48 of the present invention may take the form of a plug or a receptacle, or any other style connector to physically mate with a corresponding communication connector prone to produce crosstalk. The patch panel 100 is configured to provide compensation for both forward and reverse crosstalk originating in the conventional plug connectors 40 as near-end crosstalk or in circuits on the IDC side of the patch panel as far-end crosstalk.

The conventional development of Category 6 component compliant patch panels per TIA-568-B.2-1 for near-end crosstalk involves understanding the nature of the crosstalk created in RJ45 plugs and applying cancellation techniques in the patch panels. The cancellation techniques include introducing crosstalk of opposite polarity to that created in the plug connector through capacitance and inductance added and/or modified in the patch panel.

Factors that add and/or modify capacitance and inductance in the patch panel include arrangement of tines of jack connectors, sizing of jack connectors, placement of signal traces found within the circuit board 102 and the IDCs 104, and adding interdigitated capacitors found within the circuit board.

As discussed, twisted pair signaling uses pairs of wires with a first wire of the pair designated as "tip" and the second wire of the pair designated as "ring." The voltage and currents found on each "tip" wire and each "ring" wire of a pair are of opposite polarity where the "tip" wire of a "tip"–"ring" pair of wires is at a positive voltage relative to the "ring" wire of the pair. These opposite polarity aspects of twisted pair signaling are used by the described implementations to reduce crosstalk. In particular, to compensate for crosstalk caused by a first capacitive coupling between two wires, a second capacitive coupling between the two wires can be purposefully added at a second location to produce crosstalk having a magnitude opposite to the crosstalk found at the first location. Since the first coupling and the second coupling result in crosstalk with opposite polarity, the crosstalk associated with the first coupling and the crosstalk associated with the second coupling tend to cancel each other resulting in substantially reduced levels of crosstalk.

Thus, to compensate for a first crosstalk originating in the plug connector 40, a second crosstalk could be introduced at the patch panel 100 of an equal amount and with an opposite sign with respect to the first crosstalk. Some conventional jack designs use capacitive coupling of a polarity opposite to the polarity of unwanted coupling found in the conventional plug connector 40 to deliberately introduce crosstalk having polarity opposite to the polarity of the unwanted crosstalk originating in the conventional plug connector.

According to the terminology used herein, capacitive coupling between two wires of the same polarity, such as between two "tip" wires or between two "ring" wires, is referred to as positive capacitive coupling, whereas capacitive coupling between two wires of opposite polarity, such as between a "tip" wire and a "ring" wire, is referred to as negative capacitive coupling. Capacitance produced with parallel plates and capacitance produced by closely spaced lengths of wire are conventional methods used to achieve capacitive coupling opposite in sign of and to compensate for unwanted capacitive coupling. Conventional approaches have taken an approach in mitigating crosstalk that crosstalk between various conductor pairs of the plug connectors could be considered as having nearly identical magnitudes and thus being symmetrically arranged.

Figure 5:
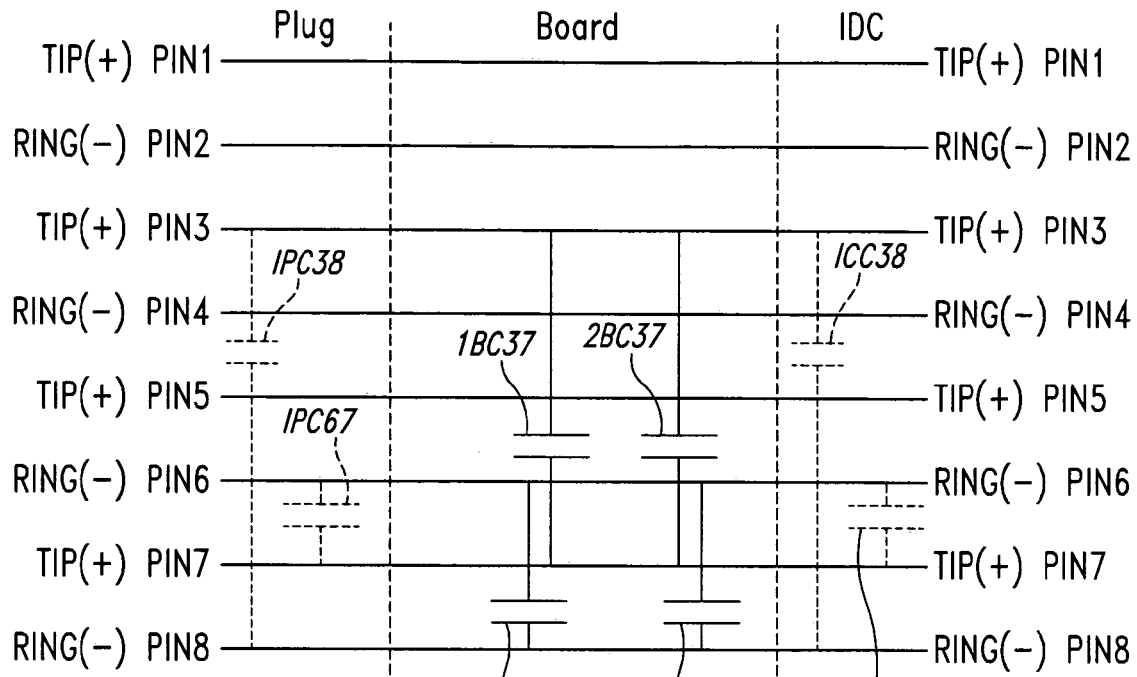
FIG. 5 is an electrical schematic of a first exemplary implementation of conventional crosstalk compensation.

In particular, as shown in FIG. 5 the plug connector 40 can have an inherent plug capacitance (IPC) between pin 3 and pin 8 (designated as IPC38) and between pin 6 and pin 7 (designated as IPC67). Likewise, the IDC 104 can have an inherent connector capacitance (ICC) between pin 3 and pin 8 (designated as ICC38) and between pin 6 and pin 7 (designated as ICC67). Conventional approaches would introduce compensating board capacitance (BC) by interdigitated wire traces on the circuit board 102 as follows.

A board capacitance 1BC37 between pin 3 and pin 7 plus a board capacitance 1BC68 between pin 6 and pin 8 would be used to compensated for the inherent plug capacitances IPC38 and IPC67. Following conventional approaches, the board capacitances 1BC37 and 1BC68 would equal each other and add to the sum of the inherent plug capacitances IPC38 and IPC67 since by conventional assumption the inherent plug capacitances IPC38 and IPC67 have identical values.

Similarly, a board capacitance 2BC37 between pin 3 and pin 7 plus a board capacitance 2BC68 between pin 6 and pin 8 would be used to compensated for the inherent connector capacitances ICC38 and ICC67. Following conventional approaches, the board capacitances 2BC37 and 2BC68 would equal each other and add to the sum of the inherent connector capacitances ICC38 and ICC67 since by conventional assumption the inherent connector capacitances ICC38 and ICC67 have identical values.

Figure 6:
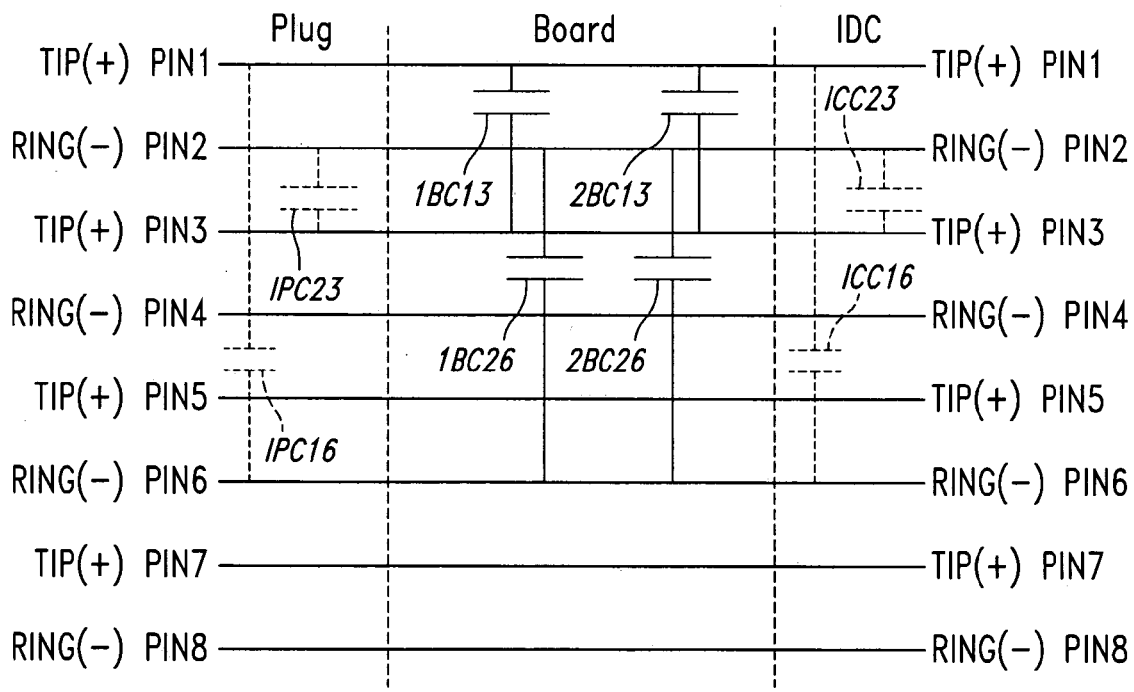
FIG. 6 is an electrical schematic of a second exemplary implementation of conventional crosstalk compensation.

As another example of conventional compensation shown in FIG. 6, the plug connector 40 can have an inherent plug capacitance (IPC) between pin 1 and pin 6 (designated as IPC16) and between pin 2 and pin 3 (designated as IPC23). Likewise, the IDC 104 can have an inherent connector capacitance (ICC) between pin 1 and pin 6 (designated as ICC16) and between pin 2 and pin 3 (designated as ICC23). Conventional approaches would introduce discrete compensating board capacitance (BC) by interdigitated wire traces on the circuit board 102 as follows.

A board capacitance 1BC13 between pin 1 and pin 3 plus a board capacitance 1BC26 between pin 2 and pin 6 would be used to compensated for the inherent plug capacitances IPC16 and IPC23. Following conventional approaches, the board capacitances 1BC13 and 1BC26 would equal each other and add to the sum of the inherent plug capacitances IPC16 and IPC23 since by conventional assumption the inherent plug capacitances IPC16 and IPC23 have identical values.

Similarly, a board capacitance 2BC13 between pin 1 and pin 3 plus a board capacitance 2BC26 between pin 2 and pin 6 would be used to compensated for the inherent connector capacitances ICC16 and ICC23. Following conventional approaches, the board capacitances 2BC13 and 2BC26 would equal each other and add to the sum of the inherent connector capacitances ICC16 and ICC23 since by conventional assumption the inherent connector capacitances ICC16 and ICC23 have identical values.

Unfortunately, these conventional approaches have ignored conditions where crosstalk between pair combinations, such as for FIG. 5, the pair combination of pair 3 (pins 3 and 6) and pair 4 (pins 7 and 8) in a conventional plug connector creates crosstalk asymmetrically, so that the magnitudes of various crosstalk signals differ. This is due to the asymmetrical arrangement of separation distance between pin 3 (tip of pair 3) and pin 8 (ring of pair 4) compared with separation distance between pin 6 (ring of pair 3) and pin 7 (tip of pair 4). Since the pins 6 and 7 are physically closer to each other than are the pins 3 and 8, a stronger capacitive crosstalk is created between pins 6 and 7 compared to pins 3 and 8. Conventional compensation techniques ignore this imbalance, resulting in lowered performance.

Similarly, in the case shown in FIG. 6, these conventional approaches have ignored conditions where crosstalk between the pair combination of pair 2 (pins 1 and 2) and pair 3 (pins 3 and 6) in a conventional plug connector also creates crosstalk asymmetrically. This is due to the asymmetrical arrangement of separation distance between pin 2 (ring of pair 2) and pin 3 (tip of pair 3) compared with separation distance between pin 1 (tip of pair 2) and pin 6 (ring of pair 3). Since the pins 2 and 3 are physically closer to each other than are the pins 1 and 6, a stronger capacitive crosstalk is created between pins 2 and 3 compared to pins 1 and 6. Conventional compensation techniques also ignore this imbalance, resulting in lowered performance.

In these conventional approaches, the compensating capacitances added to the circuit board 102 by interdigitated wire traces were of opposite sign than the inherent capacitances found in the plug connector 40 and the IDC 104. As shown in FIGS. 5 and 6, the inherent capacitances in the plug connector 40 and the IDC 104 spanned between a tip pin and a ring pin whereas the conventional compensating board capacitances spanned between either two ring pins or two tip pins.

Figure 7:
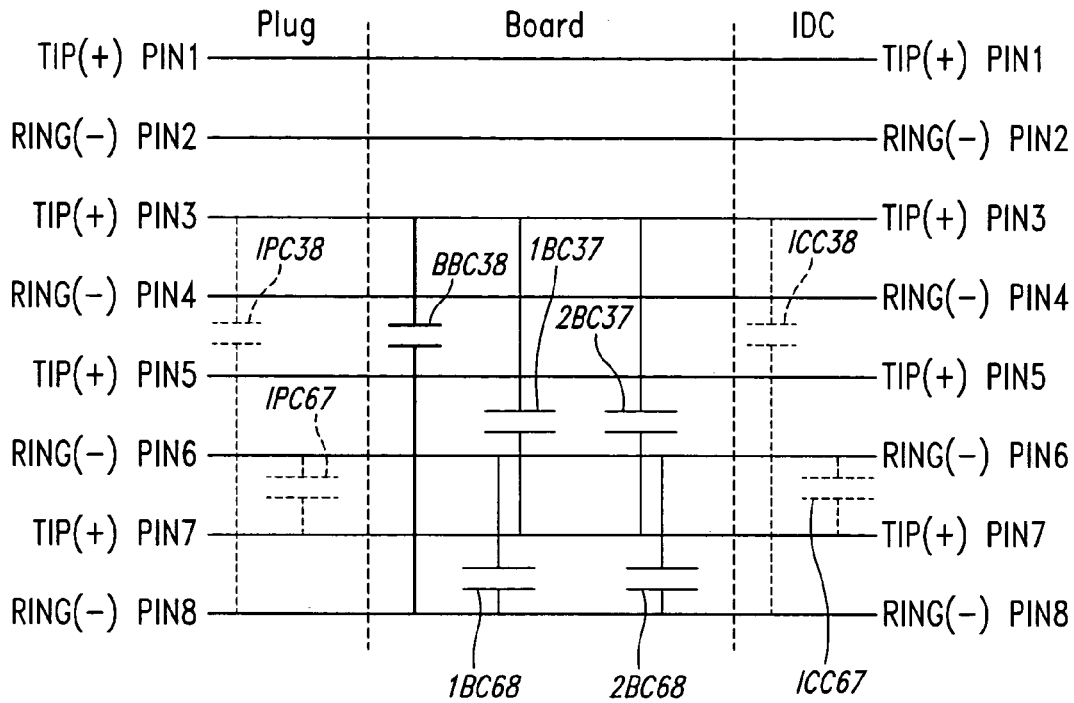
FIG. 7 is an electrical schematic of a first exemplary implementation of crosstalk compensation with balanced capacitance.
Figure 8:
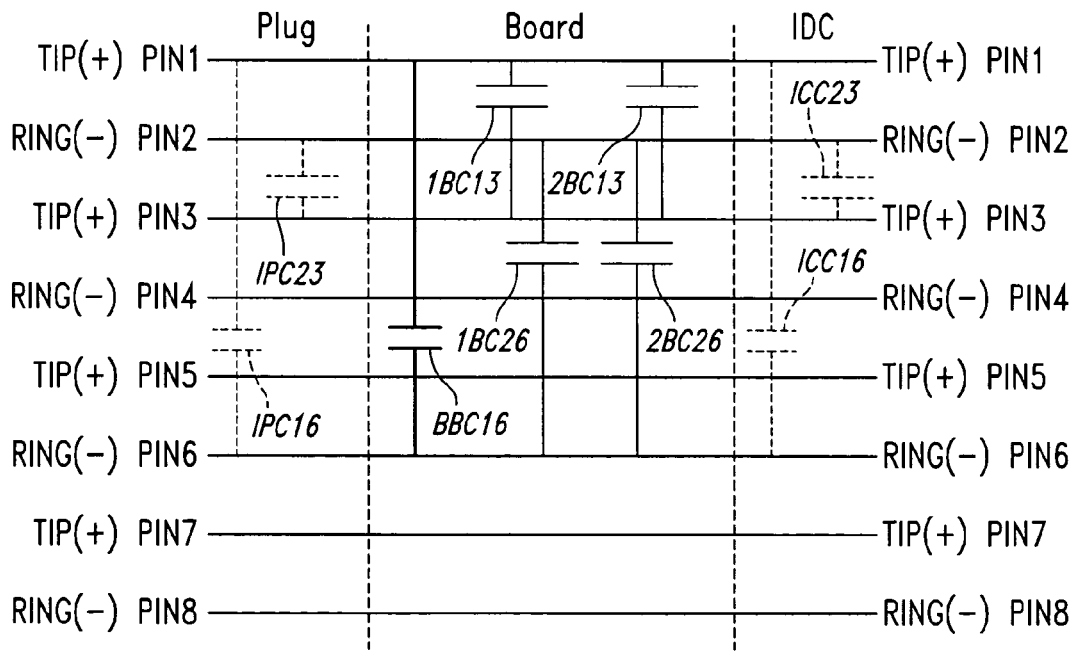
FIG. 8 is an electrical schematic of a second exemplary implementation of crosstalk compensation with balanced capacitance.

According to the present invention, exemplary implementations as depicted in FIGS. 7 and 8 propose a counterintuitive approach for compensation by first adding additional capacitance of the same sign as found with the inherent plug and connector capacitances. For example, as shown in FIG. 7, a balancing board capacitance BCC38 is added to the circuit board 102 by interdigitated capacitance, which is of the same sign as the inherent plug capacitance IPC38 and the inherent connector capacitance ICC38. The balancing board capacitance BCC38 is added in the example depicted in FIG. 7 because, as explained above, the pin 3 is farther from the pin 8 than the pin 6 is from the pin 7 so the inherent capacitance between the pin 3 and the pin 8 is smaller than the inherent capacitance between the pin 6 and the pin 7 both in the plug connector 40 and also in the IDC 104. By adding the balancing board capacitance BCC38 to the circuit board 102, the capacitances between pin 3 and pin 8 are closer to being equal to the inherent capacitances between the pin 6 and the pin 7 in the plug connector and the IDC, which makes compensation with interdigitated capacitances 1BC68, 2BC68, 1BC37, and 2BC37 added to the circuit board 102 more feasible as explained further below.

Another example is shown in FIG. 8 where a balancing board capacitance BCC16 is added to the circuit board 102 by interdigitated capacitance, which is of the same sign as the inherent plug capacitance IPC16 and the inherent connector capacitance ICC16. In the case depicted in FIG. 8, the balancing board capacitance BCC16 is added because, as explained above, the pin 1 is farther from the pin 6 than the pin 2 is from the pin 3 so the inherent capacitance between the pin 1 and the pin 6 is smaller than the inherent capacitance between the pin 2 and the pin 3 both in the plug connector 40 and also in the IDC 104. By adding the balancing board capacitance BCC16 to the circuit board 102, the capacitances between pin 1 and pin 6 are closer to being equal to the inherent capacitances between the pin 2 and the pin 3 in the plug connector and the IDC, which makes compensation with interdigitated capacitances 1BC13, 2BC13, 1BC26, and 2BC26 added to the circuit board 102 more feasible.

For the exemplary compensation implementation depicted in FIG. 7, a theoretical goal would be to approach a current existence of two conditions:

1.) the capacitances IPC38+BCC38+ICC38=IPC67+ICC67 (which requires the positive difference between the inherent capacitance across pin 3 and pin 8 (the far spaced pins) and the inherent capacitance across pin 6 and pin 7 (the near spaced pins) to be equal to the balancing capacitance).

2.) the capacitances IPC38+BCC38+ICC38+IPC67+ICC67=1BC37+2BC37+1BC68+2BC68 (which requires the sum of the inherent capacitances and the balanced capacitance to be equal to the added interdigitated capacitances).

How recommended values for the added capacitances are determined for a given configuration of the patch panel 100 can be based upon an iterative process where capacitance is added to the circuit board, measurements are made, and then further addition or subtraction of capacitance is done depending upon analysis and so on. An iterative approach can be useful to determine proper capacitances to be added to the circuit board 102 since values for the inherent capacitances in the plug connector 40 and the IDC 104 may be affected by capacitances found elsewhere. With some exemplary implementations, refinements to determine proper values to use for the capacitances to be added to the circuit board 102 were accomplished through an iterative process utilizing both electromagnetic simulation modeling software with finite element analysis known in the art and furnished by Ansoft Corporation, Pittsburgh, Pa. running on an HP J5000 Unix computer and with electronic test analyzer equipment furnished by Hewlett Packard Corporation including models HP 4380S96, HP 4396B, and HP 4380A. For some tests, the test analyzer was connected to wire pairs 1–4 connected to the plug connector 40. The plug connector 40 was coupled to the patch panel 100 through the physical engagement mechanism of the jack connector 48.

With the mentioned exemplary implementation, the electromagnetic simulation modeling software was generally used to test ideas for particular layout designs for the circuit board 102. The electronic test analyzer was used further to test design layouts and to further refine layout dimensions to achieve reductions in crosstalk. The test analyzer was used to send signals to the patch panel 100 through the conventional plug connector 40 on a first pair of wires connected to the conventional plug connector and then was used to measure resultant amounts of crosstalk occurring on second, third, and fourth pairs of wires connected to the patch panel. Both near-end crosstalk and far-end crosstalk were measured and refinements to the circuit board 102 were made until reductions in both near-end crosstalk and far-end crosstalk to satisfy category 6 performance were achieved with the patch panel 102 coupled to the conventional plug connector 40.

Measured capacitances for the example shown in FIG. 7 are as follows:

Inherent capacitances:
IPC38: 0.25 pf, IPC67: 0.6 pf, ICC38: 0.25 pf, ICC67: 0.5 pf.

Added Capacitances:
BBC38: 0.47 pf, 1BC37: 0.46 pf, 2BC37: 0.91 pf, 1BC68: 0.15 pf, 2BC68: 0.67 pf.

Measured capacitances for the example shown in FIG. 8 are as follows:

Inherent capacitances:
IPC23: 0.6 pf, IPC16: 0.25 pf, ICC23: 0.5 pf, ICC16: 0.25 pf.

Added Capacitances:
BBC16: 0.47 pf, 1BC13: 0.15 pf, 2BC13: 0.67 pf, 1BC26: 0.46 pf, 2BC26: 0.91 pf.

Figure 9:
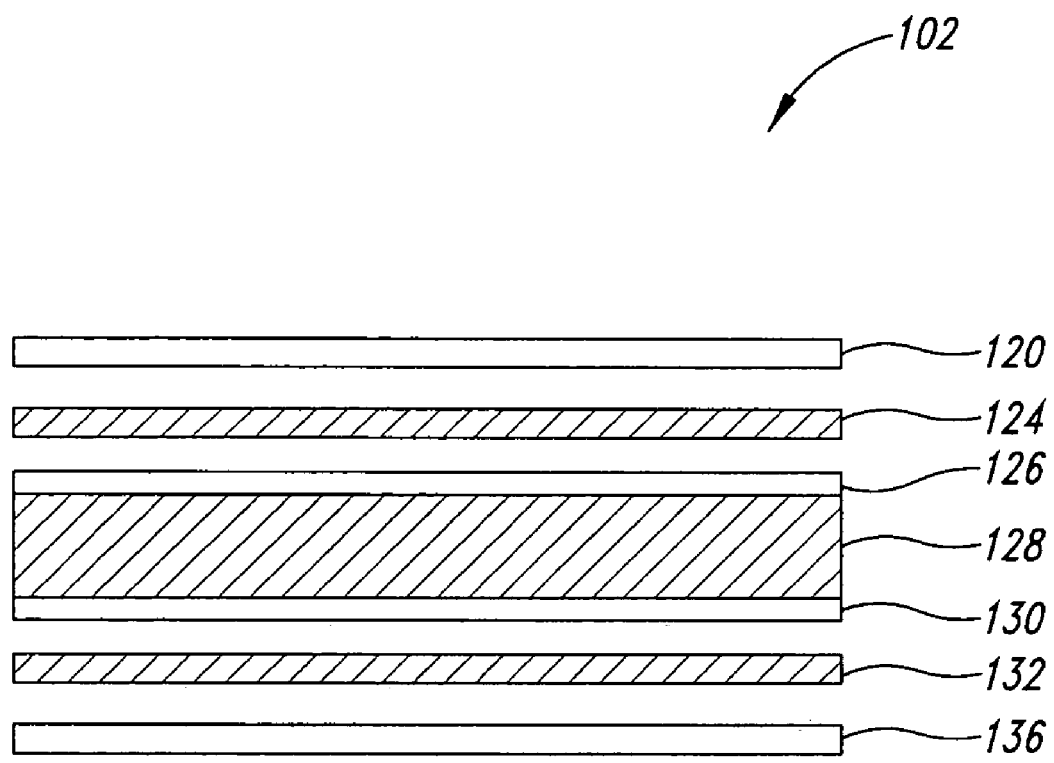
FIG. 9 is a schematic diagram showing an exemplary lamination sequence for the circuit board of the patch panel of FIG. 3.

An exemplary implementation of the circuit board 102 for the exemplary circuit of FIG. 8 is shown in FIG. 9 as having first and fourth wire trace layers 120 and 136 made from 2.0 oz finished copper, second and third wire trace layers 126 and 130 made from 2.0 oz finished copper, a first dielectric layer 128 being 0.028 inches thick and having a dielectric constant of 4.0, and first and second bonding material layers 124 and 132 being 0.009 inches thick. As shown in FIG. 9, an order of layering for the circuit board 102 is as follows: the first wire trace layer 120, the first bonding material layer 124, the second wire trace layer 126, the first dielectric layer 128, the third wire trace layer 130, the second bonding material layer 132, and the fourth wire trace layer 136.

Figure 10:
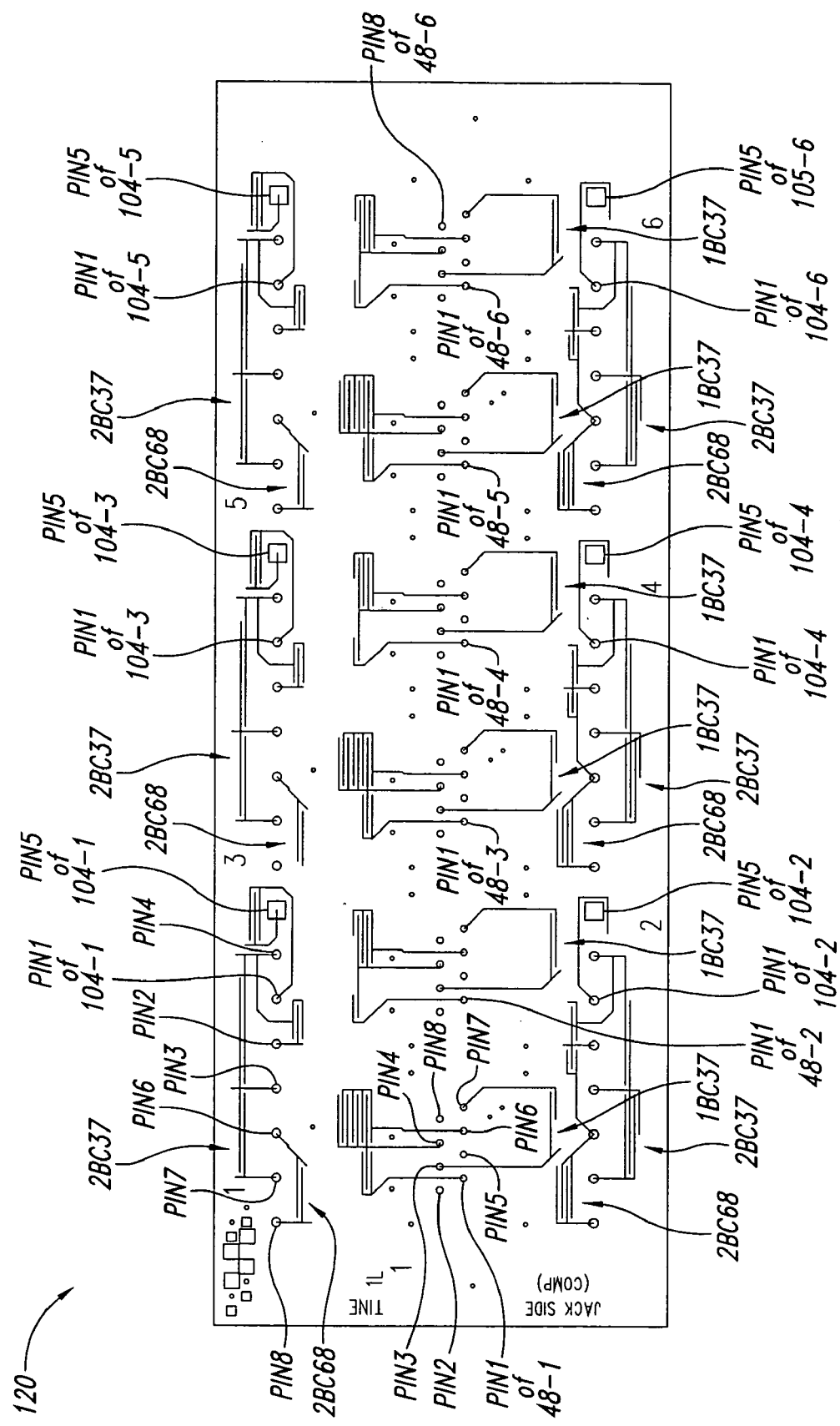
FIG. 10 is a schematic diagram showing the first wire trace layer of the lamination sequence of FIG. 9 for the first balanced capacitance implementation of FIG. 7.

The wire trace of the first wire trace layer 120 of the depicted implementation is shown in FIG. 10. The first wire trace layer 120 includes a first plurality of wire connector pads (referred to herein as "the plurality of jack pads"), selected pads of the plurality of jack pads being labeled on the FIG. 10 with the pin number and jack connector number of the contact member 50 of the jack connector 48 to which the pad is electrically coupled. For example, one of the plurality of jack pads shown on FIG. 10 and labeled pin 1 of 48-4 would be electrically coupled to the contact member 50a associated with pin 1 of the jack connector 48-4 of the patch panel 100.

The first wire trace layer 120 also includes a second plurality of wire connector pads (referred to herein as "the plurality of IDC pads"), selected pads of the plurality of IDC pads being labeled in FIG. 10 with the pin number associated with one of the wire slots 108 and its connector element (such as pin 1 is associated with wire slot 108-1 and its connector element) of the IDC 104. For example, one of the plurality of IDC pads shown in FIG. 10 and labeled pin 1 of 104-4 would be electrically coupled to the connector element associated with the wire slot 108-1 of the IDC 104-4 of the patch panel 100. The plurality of jack pads and the plurality of IDC pads are similarly labeled on the second, third, and fourth wire trace layers 126, 130, and 136 shown in FIGS. 11, 12, and 13, respectively, and extend through holes formed in the circuit board 102.

One purpose for the first wire trace layer 120 is to add capacitive coupling using interdigitated wire traces as is done with capacitive wire trace portions shown in FIG. 10 providing the 1BC37, 2BC68, and 2BC37 board capacitances shown as part of the circuit diagram of FIG. 8.

Figure 11:
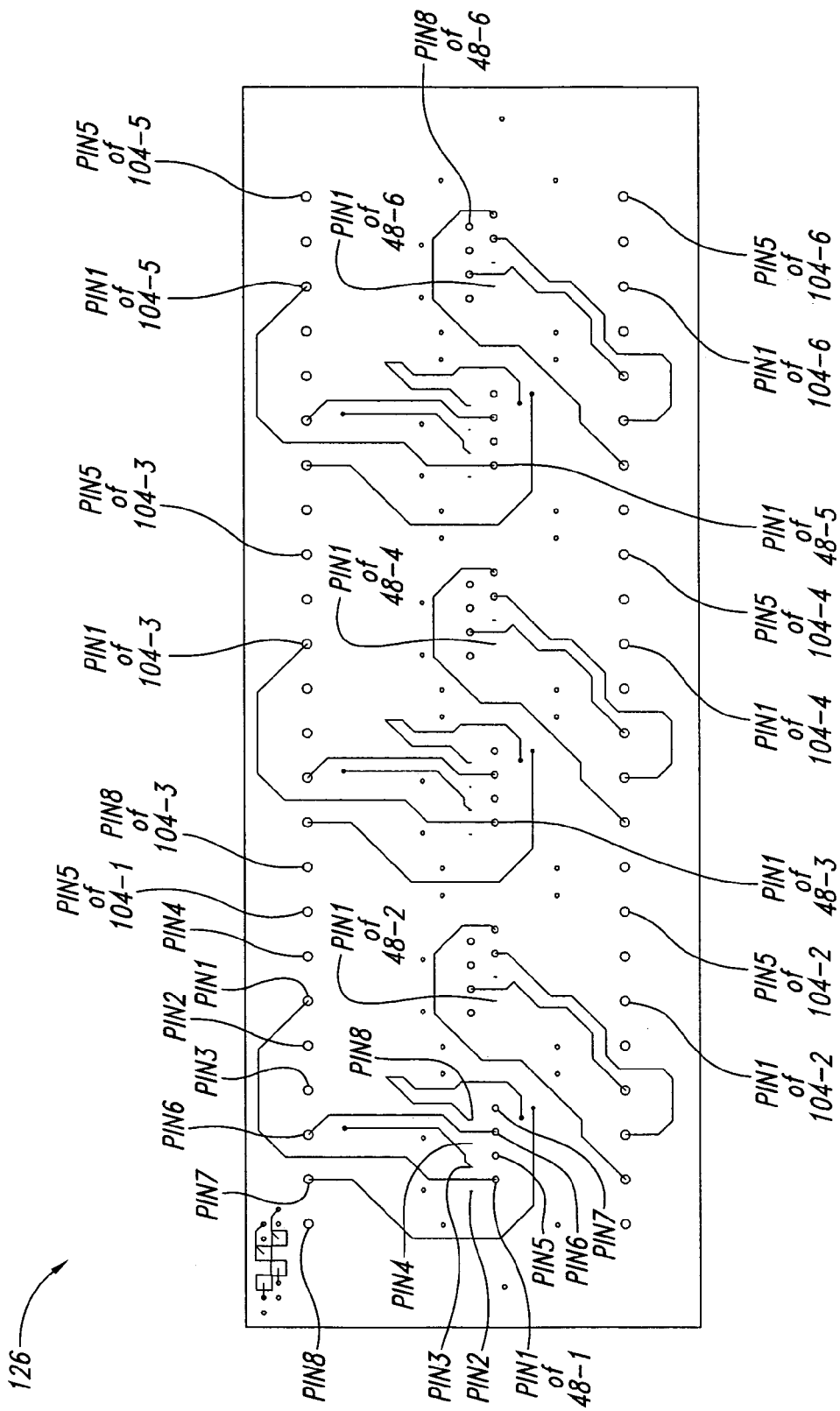
FIG. 11 is a schematic diagram showing the second wire trace layer of the lamination sequence of FIG. 9 for the first balanced capacitance implementation of FIG. 7.
Figure 12:
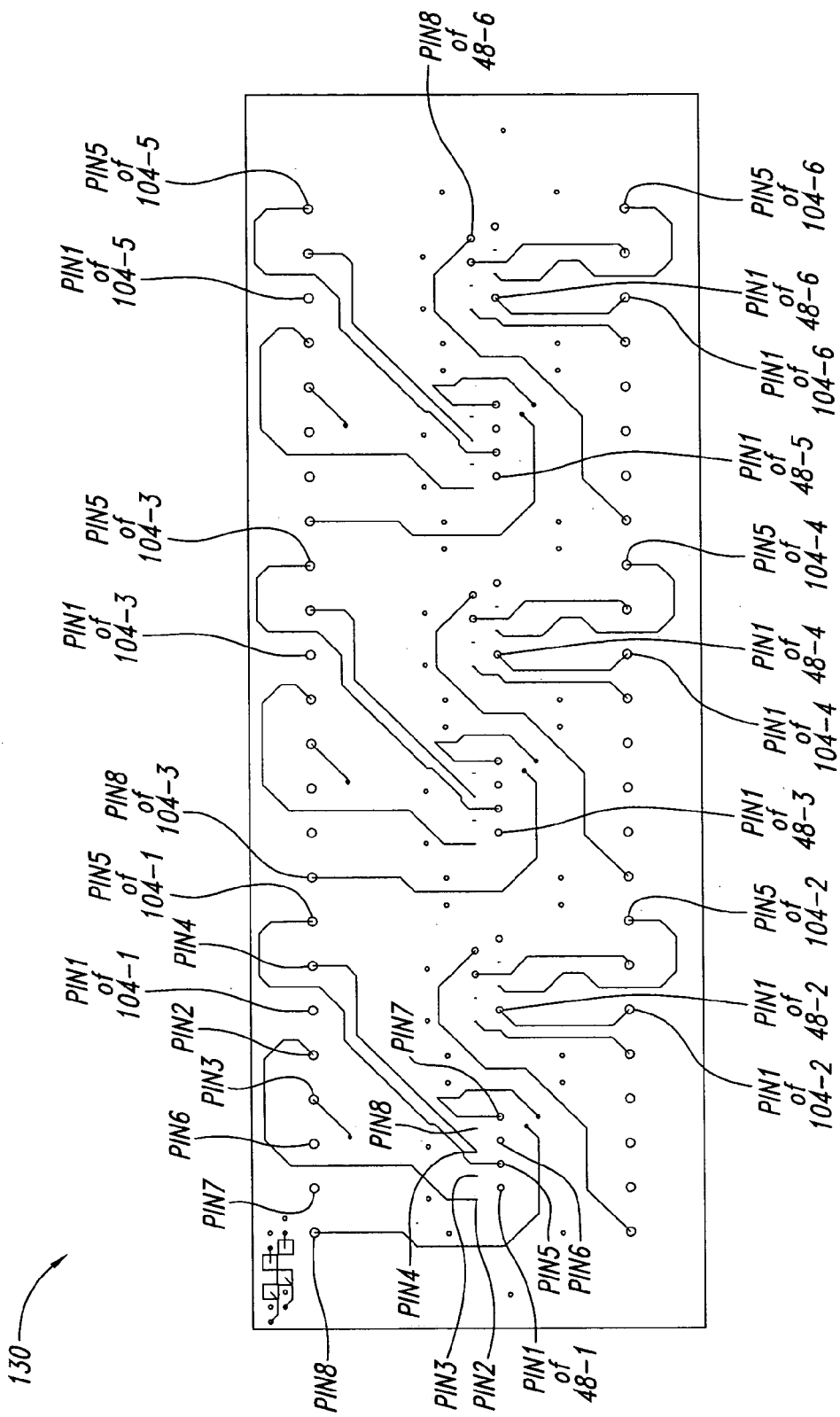
FIG. 12 is a schematic diagram showing the third wire trace layer for the lamination sequence of FIG. 9 for the first balanced capacitance implementation of FIG. 7.

The second wire trace 126 is shown in FIG. 11 and the third wire trace 130 is shown in FIG. 12 as having wire trace connections between the jack pads and the IDC pads, each connection corresponding to a particular pin number of a particular jack and its corresponding IDC. For instance, as shown in FIG. 11, a connection exists between pin 1 of 48-5 and pin 1 of 104-5.

Figure 13:
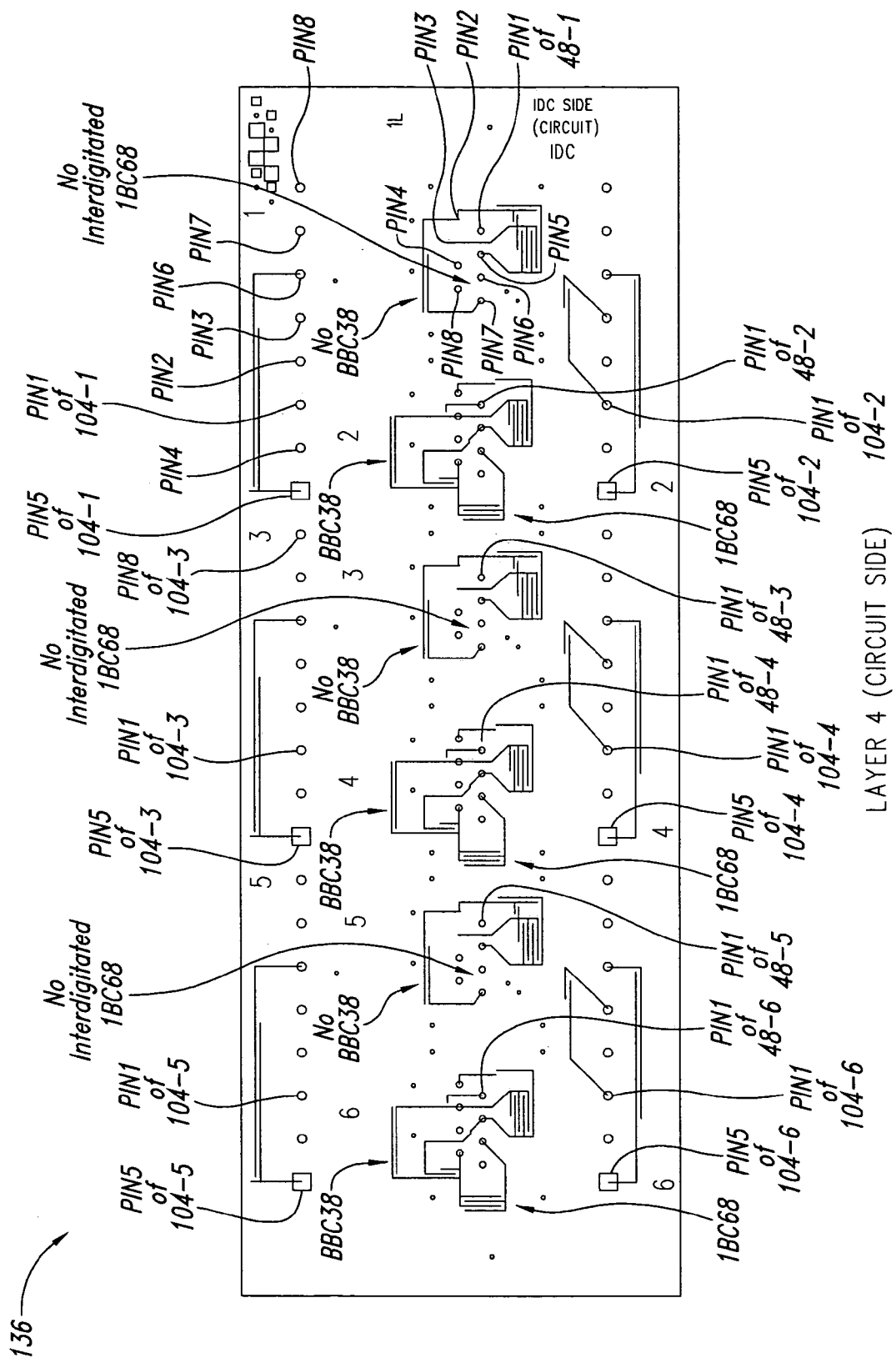
FIG. 13 is a schematic diagram showing the fourth wire trace layer for the lamination sequence of FIG. 9 for the first balanced capacitance implementation of FIG. 7.

In FIG. 13, exemplary implementations of compensation are shown only for jack connectors 48-2, 48-4, and 48-6 and not for jack connectors 48-1, 48-3, and 48-5. The fourth wire trace layer 136 adds capacitive coupling with capacitive wire trace portions shown in FIG. 13 providing the 1BC68 and BBC38 capacitances for the jack connectors 48-2, 48-4, and 48-6, but not for the jack connectors 48-1, 48-3, and 48-5. For the exemplary circuit board 102 of FIGS. 9–13, no balancing capacitance BBC38 has been implemented for the jack connectors 48-1, 48-3, and 48-5 and no interdigitated capacitance 1BC68 is present for the jack connectors 48-1, 48-3, and 48-5. Further implementations of the patch panel 100 also use interdigitated wire traces to add capacitance whereas other embodiments use other ways of adding capacitance known in the art such as through discrete capacitive components.

It should also be noted that the patch panel 100 can be made in a wall mount version and other versions including those that are free-standing. The principles of the present invention are intended to encompass all such variations of communication connectors. In addition, the present invention is intended to encompass communication connectors other than the RJ45 style, and may include a greater or lesser number of twisted pair cables.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A system for at least one plug connector, the plug connector having a plurality of plug connector elements being grouped into pairs, each pair of the plurality of plug connector elements having a tip plug connector element and a ring plug connector element configured to be coupled to a different wire pair, the plug connector having a first capacitance between a tip plug connector element of a first pair of the plurality of plug connector elements and a ring plug connector element of a second pair of the plurality of plug connector elements, the plug connector having a second capacitance between a ring plug connector element of the first pair of the plurality of plug connector elements and a tip plug connector element of the second pair of the plurality of plug connector elements, the first capacitance being greater than the second capacitance, the system comprising:

a jack connector being shaped to receive the plug connector, the jack connector having a plurality of jack contact members and configured to receive the plug connector such that each of the plurality of jack contact members is electrically coupled to a different one of the plurality of plug connector elements, the plurality of jack contact members including a first tip jack contact member and a first ring jack contact member positioned to electrically couple with the tip plug connector element and the ring plug connector element, respectively, of the first pair of the plurality of plug connector elements when the jack connector receives the plug connector, and a second tip jack contact member and a second ring jack contact member positioned to electrically couple with the tip plug connector element and the ring plug connector element, respectively, of the second pair of plug connector elements when the jack connector receives the plug connector;

an insulation displacement connector (IDC) configured to receive a plurality of wires and having a plurality of IDC elements, each of the plurality of IDC elements configured to be coupled to a different one of the plurality of wires;

a circuit board having a plurality of jack pads, a plurality of IDC pads, and a plurality of internal conductors, each of the plurality of jack pads being electrically coupled to a different one of the plurality of jack contact members so that a first tip jack pad, a first ring jack pad, a second tip jack pad, and a second ring jack pad are electrically coupled to the first tip jack contact member, the first ring jack contact member, the second tip jack contact member, and the second ring jack contact member, respectively, each of the plurality of IDC pads being electrically coupled to a different one of the plurality of IDC elements, each of the plurality of internal conductors being electrically coupled to a different one of the plurality of jack pads and a different one of the plurality of IDC pads; and a third capacitance electrically coupled between the first ring jack pad and the second tip jack pad, the third capacitance sized, at least in part, with respect to the difference in values between the first capacitance and the second capacitance to reduce cross-talk between the first and second pairs of the plurality of plug connector elements, wherein the plurality of IDC elements are grouped into pairs, each pair of the plurality of IDC elements having a tip IDC element and a ring IDC element configured to be coupled to a different wire pair, the plurality of IDC pads of the circuit board including a first tip IDC pad electrically coupled to the first tip jack pad, a first ring IDC pad electrically coupled to the first ring jack pad, a second tip IDC pad electrically coupled to the second tip jack pad, and a second ring IDC pad electrically coupled to the second ring jack pad by ones of the plurality of internal conductors, wherein the IDC has a fourth capacitance electrically coupled between a first tip IDC element of a first pair of the plurality of IDC elements and a second ring IDC element of a second pair of the plurality of IDC elements, the first tip IDC element being electrically coupled to the first tip IDC pad, and the second ring IDC element being electrically coupled to the second ring IDC pad, a fifth capacitance electrically coupled between a first ring IDC element of the first pair of the plurality of IDC elements and a second tip IDC element of the second pair of the plurality of IDC elements, the first ring IDC element being electrically coupled to the first ring IDC pad, and the second tip IDC element being electrically coupled to the second tip IDC pad, the fourth capacitance being greater than the fifth capacitance, and wherein the third capacitance is further sized, at least in part, with respect to the difference in values between the fourth capacitance and the fifth capacitance.

2. The system of claim 1 wherein the jack connector is configured to engaged with the plug connector as an RJ45 jack connector.

3. The system of claim 1 wherein the plurality of internal conductors are a plurality of wire traces.

4. The system of claim 3 wherein the third capacitance results from at least one interdigitated portion of one of the plurality of wire traces.

5. The system of claim 1 wherein the third capacitance is further sized to approximate to a sum of the difference in values between the first capacitance and the second capacitance, plus the difference in values between the fourth capacitance and the fifth capacitance.

6. The system of claim 1, comprising a sixth capacitance electrically coupled between the first tip jack pad and the second tip jack pad, and a seventh capacitance electrically coupled between the first ring jack pad and the second ring jack pad, the sixth capacitance and the seventh capacitance being sized in values with respect to the values of the first capacitance, second capacitance, third capacitance, fourth capacitance, and fifth capacitance.

7. The system of claim 6 wherein the sixth capacitance and the seventh capacitance are sized in values so that the sum of the values of the sixth capacitance and the seventh capacitance approximates the sum of the values of the first capacitance, the second capacitance, the third capacitance, the fourth capacitance and the fifth capacitance.

8. The system of claim 6 wherein the sixth capacitance includes a plurality of adjacently arranged interdigitated wire trace capacitors, and the seventh capacitance includes a plurality of adjacently arranged interdigitated wire trace capacitors.

9. A system for at least one first connector, the first connector having a plurality of first connector elements being grouped into pairs, each pair of the plurality of first connector elements having a tip first connector element and a ring first connector element configured to be coupled to a different wire pair, the first connector having a first capacitance between a tip first connector element of a first pair of the plurality of first connector elements and a ring first connector element of a second pair of the plurality of first connector elements, the first connector having a second capacitance between a ring first connector element of the first pair of the plurality of first connector elements and a tip first connector element of the second pair of the plurality of first connector elements, the first capacitance being greater than the second capacitance, the system comprising:

a second connector being shaped to receive the first connector, the second connector having a plurality of second contact members and configured to receive the first connector such that each of the plurality of second contact members is electrically coupled to a different one of the plurality of first connector elements, the plurality of second contact members including a first tip second contact member and a first ring second contact member positioned to electrically couple with the tip first connector element and the ring first connector element, respectively, of the first pair of the plurality of first connector elements when the second connector receives the first connector, and a second tip second contact member and a second ring second contact member positioned to electrically couple with the tip first connector element and the ring first connector element, respectively, of the second pair of first connector elements when the second connector receives the first connector;

an insulation displacement connector (IDC) configured to receive a plurality of wires and having a plurality of IDC elements, each of the plurality of IDC elements configured to be coupled to a different one of the plurality of wires;

a circuit board having a plurality of second connector pads, a plurality of IDC pads, and a plurality of internal conductors, each of the plurality of second connector pads being electrically coupled to a different one of the plurality of second contact members so that a first tip second connector pad, a first ring second connector pad, a second tip second connector pad, and a second ring second connector pad are electrically coupled to the first tip second contact member, the first ring second contact member, the second tip second contact member, and the second ring second contact member, respectively, each of the plurality of IDC pads being electrically coupled to a different one of the plurality of IDC elements, each of the plurality of internal conductors being electrically coupled to a different one of the plurality of second connector pads and a different one of the plurality of IDC pads; and a third capacitance electrically coupled between the first ring second pad and the second tip second pad, the third capacitance sized, at least in part, with respect to the difference in values between the first capacitance and the second capacitance wherein the plurality of IDC elements are grouped into pairs, each pair of the plurality of IDC elements having a tip IDC element and a ring IDC element configured to be coupled to a different wire pair, the plurality of IDC pads of the circuit board including a first tip DC pad electrically coupled to the first tip second pad, a first ring IDC pad electrically coupled to the first ring second pad, a second tip IDC pad electrically coupled to the second tip second pad, and a second ring IDC pad electrically coupled to the second ring second pad by ones of the plurality of internal conductors, wherein the IDC has a fourth capacitance electrically coupled between a first tip IDC element of a first pair of the plurality of IDC elements and a second ring IDC element of a second pair of the plurality of IDC elements, the first tip IDC element being electrically coupled to the first tip IDC pad, and the second ring IDC element being electrically coupled to the second ring IDC pad, a fifth capacitance electrically coupled between a first ring IDC element of the first pair of the plurality of IDC elements and a second tip IDC element of the second pair of the plurality of IDC elements, the first ring IDC element being electrically coupled to the first ring IDC pad, and the second tip IDC element being electrically coupled to the second tip IDC pad, the fourth capacitance being greater than the fifth capacitance, and wherein the third capacitance is further sized at least in part, with respect to the difference in values between the fourth capacitance and the fifth capacitance.

10. A system for at least one plug connector, the plug connector having a plurality of plug connector elements being grouped into pairs, each pair of the plurality of plug connector elements having a tip plug connector element and a ring plug connector element configured to be coupled to a different wire pair, the plug connector having a first capacitance between a tip plug connector element of a first pair of the plurality of plug connector elements and a ring plug connector element of a second pair of the plurality of plug connector elements, the plug connector having a second capacitance between a ring plug connector element of the first pair of the plurality of plug connector elements and a tip plug connector element of the second pair of the plurality of plug connector elements, the first capacitance being greater than the second capacitance, the system comprising:

a jack connector being shaped to receive the plug connector, the jack connector having a plurality of jack contact members and configured to receive the plug connector such that each of the plurality of jack contact members is electrically coupled to a different one of the plurality of plug connector elements, the plurality of jack contact members including a first tip jack contact member and a first ring jack contact member being positioned to electrically couple with the tip plug connector element and the ring plug connector element, respectively, of the first pair of the plurality of plug connector elements when the jack connector receives the plug connector, and a second tip jack contact member and a second ring jack contact member being positioned to electrically couple with the tip plug connector element and the ring plug connector element, respectively, of the second pair of plug connector elements when the jack connector receives the plug connector;

a third capacitance electrically coupled between the first ring jack contact member and the second tip jack contact member, the third capacitance sized, at least in part, with respect to the difference in values between the first capacitance and the second capacitance;

a plurality of insulation displacement connector (IDC) elements being grouped into pairs, each pair of the plurality of IDC elements having a tip IDC element and a ring IDC element configured to be coupled to a different wire pair, the plurality of IDC elements including a first tip IDC element being electrically coupled to the first tip jack contact member, a first ring IDC element being electrically coupled to the first ring jack contact member, a second tip IDC element being electrically coupled to the second tip jack contact member and a second ring IDC element being electrically coupled to the second ring jack contact member;

a fourth capacitance electrically coupled between the first tip IDC element and the second ring IDC element; and a fifth capacitance electrically coupled between the first ring IDC element and the second tip IDC element, the fourth capacitance being greater than the fifth capacitance, and wherein the third capacitance is further sized at least in part, with respect to the difference in values between the fourth capacitance and the fifth capacitance.

11. e system of claim 10 herein the third capacitance is further sized to approximate a sum of the difference in values between the first capacitance and the second capacitance, plus the difference in values between the fourth capacitance and the fifth capacitance.

12. The system of claim 10, comprising a sixth capacitance electrically coupled between the first tip jack contact member and the second tip jack contact member, and a seventh capacitance electrically coupled between the first ring jack contact member and the second ring jack contact member, the sixth capacitance and the seventh capacitance being sized in values with respect to the values of the first capacitance, second capacitance, third capacitance, fourth capacitance, and fifth capacitance.

13. The system of claim 12 wherein the sixth capacitance and the seventh capacitance are sized in values so that the sum of the values of the sixth capacitance and the seventh capacitance approximates the sum of the values of the first capacitance, the second capacitance, the third capacitance, the fourth capacitance and the fifth capacitance.

14. The system of claim 12 wherein the sixth capacitance includes a plurality of adjacently arranged interdigitated wire trace capacitors, and the seventh capacitance includes a plurality of adjacently arranged interdigitated wire trace capacitors.

* * * * *